(12) United States Patent
Schieve et al.

(10) Patent No.: US 7,871,470 B2
(45) Date of Patent: Jan. 18, 2011

(54) SUBSTRATE SUPPORT LIFT MECHANISM

(75) Inventors: Eric W. Schieve, Palo Alto, CA (US);
Keith K. Koai, Los Gatos, CA (US);
David T. Or, San Jose, CA (US); Rene T. Correa, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1231 days.

(21) Appl. No.: 11/426,555

(22) Filed: Jun. 26, 2006

(65) Prior Publication Data

US 2006/0240542 A1    Oct. 26, 2006

Related U.S. Application Data

(63) Continuation of application No. 10/387,619, filed on Mar. 12, 2003, now abandoned.

(51) Int. Cl.
*H01L 21/00* (2006.01)

(52) U.S. Cl. .................. 118/728; 414/680; 204/298.01; 156/345.23

(58) Field of Classification Search .................. 414/680; 118/728; 156/345.23; 204/298.01
See application file for complete search history.

(56) References Cited

U.S. PATENT DOCUMENTS

| 202,473 | A | 4/1878 | Rowell |
|---|---|---|---|
| 309,438 | A | 12/1884 | Carleton |
| 539,796 | A | 5/1895 | Close |
| 1,100,504 | A | 6/1914 | Taft |
| 1,104,666 | A | 7/1914 | Harris |
| 1,173,289 | A | 2/1916 | McKee et al. |
| 1,550,651 | A | 8/1925 | Charter |
| 2,499,146 | A | 2/1950 | Kindt |
| 2,619,215 | A | 11/1952 | Guss |
| 2,921,326 | A | 1/1960 | Lautmann |
| 2,972,493 | A | 2/1961 | Waters |
| 3,582,116 | A | 6/1971 | Young |
| 3,876,174 | A | 4/1975 | Culver |
| 4,058,430 | A | 11/1977 | Suntola et al. |

(Continued)

FOREIGN PATENT DOCUMENTS

EP    0 284 343    9/1988

(Continued)

OTHER PUBLICATIONS

PCT International Search Report dated Apr. 18, 2005 for PCT/US04/007164.

(Continued)

*Primary Examiner*—Sylvia R. MacArthur
(74) *Attorney, Agent, or Firm*—Patterson & Sheridan, LLP

(57) ABSTRACT

An apparatus for positioning a substrate support within a processing chamber is provided. In one embodiment, an apparatus for positioning a substrate support includes a yoke comprising a curved surface with a first slot formed therethrough, a base comprising a first surface adapted to support the substrate support and a curved second surface, wherein the curved second surface mates with the curved surface of the yoke and a first slot is formed through the curved second surface of the base, and a first threaded member disposed through the first slot in the yoke and the first slot in the base.

6 Claims, 8 Drawing Sheets

U.S. PATENT DOCUMENTS

| | | | |
|---|---|---|---|
| 4,389,973 A | 6/1983 | Suntola et al. |
| 4,413,022 A | 11/1983 | Suntola et al. |
| 4,415,275 A | 11/1983 | Dietrich |
| 4,607,974 A | 8/1986 | Brothers et al. |
| 4,629,321 A | 12/1986 | Hart et al. |
| 4,761,269 A | 8/1988 | Conger et al. |
| 4,834,831 A | 5/1989 | Nishizawa et al. |
| 4,891,087 A | 1/1990 | Davis et al. |
| 4,975,252 A | 12/1990 | Nishizawa et al. |
| 4,993,357 A | 2/1991 | Scholz |
| 5,027,746 A | 7/1991 | Frijlink |
| 5,173,327 A | 12/1992 | Sandhu et al. |
| 5,178,681 A | 1/1993 | Moore et al. |
| 5,225,366 A | 7/1993 | Yoder |
| 5,261,959 A | 11/1993 | Gasworth |
| 5,281,274 A | 1/1994 | Yoder |
| 5,292,393 A | 3/1994 | Maydan et al. |
| 5,294,286 A | 3/1994 | Nishizawa et al. |
| 5,338,362 A | 8/1994 | Imahashi |
| 5,374,570 A | 12/1994 | Nasu et al. |
| 5,441,703 A | 8/1995 | Jurgensen |
| 5,443,647 A | 8/1995 | Aucoin et al. |
| 5,462,603 A | 10/1995 | Murakami |
| 5,480,818 A | 1/1996 | Matsumoto et al. |
| 5,483,919 A | 1/1996 | Yokoyama et al. |
| 5,503,875 A | 4/1996 | Imai et al. |
| 5,558,717 A | 9/1996 | Zhao et al. |
| 5,562,947 A | 10/1996 | White et al. |
| 5,634,757 A | 6/1997 | Schanz |
| 5,674,786 A | 10/1997 | Turner et al. |
| 5,711,811 A | 1/1998 | Suntola et al. |
| 5,730,802 A | 3/1998 | Ishizumi et al. |
| 5,762,544 A | 6/1998 | Zuniga et al. |
| 5,796,066 A | 8/1998 | Guyot |
| 5,796,116 A | 8/1998 | Nakata et al. |
| 5,804,042 A | 9/1998 | Ferreira et al. |
| 5,807,792 A | 9/1998 | Ilg et al. |
| 5,835,677 A | 11/1998 | Li et al. |
| 5,848,670 A | 12/1998 | Salzman |
| 5,855,680 A | 1/1999 | Soininen et al. |
| 5,860,640 A | 1/1999 | Marohl et al. |
| 5,868,847 A | 2/1999 | Chen et al. |
| 5,879,128 A | 3/1999 | Tietz et al. |
| 5,879,459 A | 3/1999 | Gadgil et al. |
| 5,900,062 A | 5/1999 | Loewenhardt et al. |
| 5,916,365 A | 6/1999 | Sherman |
| 5,951,775 A | 9/1999 | Tepman |
| 5,972,430 A | 10/1999 | DiMeo, Jr. et al. |
| 6,001,234 A | 12/1999 | Batz, Jr. et al. |
| 6,015,590 A | 1/2000 | Suntola et al. |
| 6,042,652 A | 3/2000 | Hyun et al. |
| 6,071,572 A | 6/2000 | Mosely et al. |
| 6,089,723 A | 7/2000 | Ogasawara et al. |
| 6,102,164 A | 8/2000 | McClintock et al. |
| 6,120,609 A | 9/2000 | Selyutin et al. |
| 6,139,700 A | 10/2000 | Kang et al. |
| 6,146,504 A | 11/2000 | Patadia et al. |
| 6,168,668 B1 | 1/2001 | Yudovsky |
| 6,174,377 B1 | 1/2001 | Doering et al. |
| 6,183,563 B1 | 2/2001 | Choi et al. |
| 6,197,683 B1 | 3/2001 | Kang et al. |
| 6,200,893 B1 | 3/2001 | Sneh |
| 6,213,478 B1 | 4/2001 | Nishikawa |
| 6,231,672 B1 | 5/2001 | Choi et al. |
| 6,270,572 B1 | 8/2001 | Kim et al. |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,447,607 B2 | 9/2002 | Soininen et al. |
| 6,454,860 B2 | 9/2002 | Metzner et al. |
| 6,478,872 B1 | 11/2002 | Chae et al. |
| 6,481,945 B1 | 11/2002 | Hasper et al. |
| 6,511,368 B1 | 1/2003 | Halley |
| 6,511,539 B1 | 1/2003 | Raaijmakers |
| 6,548,112 B1 | 4/2003 | Hillman et al. |
| 6,551,406 B2 | 4/2003 | Kilpi |
| 6,572,705 B1 | 6/2003 | Suntola et al. |
| 6,578,287 B2 | 6/2003 | Aswad |
| 6,579,372 B2 | 6/2003 | Park |
| 6,593,484 B2 | 7/2003 | Yasuhara et al. |
| 6,609,909 B2 | 8/2003 | Aoki et al. |
| 6,630,030 B1 | 10/2003 | Suntola et al. |
| 6,630,201 B2 | 10/2003 | Chiang et al. |
| 6,660,126 B2 | 12/2003 | Nguyen et al. |
| 6,716,287 B1 | 4/2004 | Santiago et al. |
| 6,718,126 B2 | 4/2004 | Lei |
| 6,734,020 B2 | 5/2004 | Lu et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,866,746 B2 | 3/2005 | Lei et al. |
| 6,868,859 B2 | 3/2005 | Yudovsky |
| 6,881,437 B2 | 4/2005 | Ivanov et al. |
| 6,902,624 B2 | 6/2005 | Seidel et al. |
| 6,921,062 B2 | 7/2005 | Gregg et al. |
| 2001/0000866 A1 | 5/2001 | Sneh et al. |
| 2001/0009140 A1 | 7/2001 | Bondestam et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0042523 A1 | 11/2001 | Kasala |
| 2001/0042799 A1 | 11/2001 | Kim et al. |
| 2001/0054377 A1 | 12/2001 | Lindfors et al. |
| 2002/0000196 A1 | 1/2002 | Park |
| 2002/0007790 A1 | 1/2002 | Park |
| 2002/0009544 A1 | 1/2002 | McFeely et al. |
| 2002/0009896 A1 | 1/2002 | Sandhu et al. |
| 2002/0011204 A1 | 1/2002 | Gujer et al. |
| 2002/0017242 A1 | 2/2002 | Hamaguchi et al. |
| 2002/0041931 A1 | 4/2002 | Suntola et al. |
| 2002/0052097 A1 | 5/2002 | Park |
| 2002/0066411 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0086106 A1 | 7/2002 | Park et al. |
| 2002/0092471 A1 | 7/2002 | Kang et al. |
| 2002/0094689 A1 | 7/2002 | Park |
| 2002/0104481 A1 | 8/2002 | Chiang et al. |
| 2002/0108570 A1 | 8/2002 | Lindfors |
| 2002/0110991 A1 | 8/2002 | Li |
| 2002/0115886 A1 | 8/2002 | Yasuhara et al. |
| 2002/0121241 A1 | 9/2002 | Nguyen et al. |
| 2002/0121312 A1 | 9/2002 | Lubomirsky et al. |
| 2002/0121342 A1 | 9/2002 | Nguyen et al. |
| 2002/0127745 A1 | 9/2002 | Lu et al. |
| 2002/0134307 A1 | 9/2002 | Choi |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2003/0004723 A1 | 1/2003 | Chihara |
| 2003/0010451 A1 | 1/2003 | Tzu et al. |
| 2003/0017697 A1 | 1/2003 | Choi et al. |
| 2003/0022338 A1 | 1/2003 | Ruben et al. |
| 2003/0042630 A1 | 3/2003 | Babcoke et al. |
| 2003/0053799 A1 | 3/2003 | Lei |
| 2003/0057527 A1 | 3/2003 | Chung et al. |
| 2003/0072913 A1 | 4/2003 | Chou et al. |
| 2003/0075273 A1 | 4/2003 | Kilpela et al. |

2003/0075387 A1 4/2003 Wang et al.
2003/0075925 A1 4/2003 Lindfors et al.
2003/0079686 A1 5/2003 Chen et al.
2003/0089308 A1 5/2003 Raaijmakers
2003/0101927 A1 6/2003 Raaijmakers et al.
2003/0101938 A1 6/2003 Ronsse et al.
2003/0106490 A1 6/2003 Jallepally et al.
2003/0113187 A1 6/2003 Lei et al.
2003/0116087 A1 6/2003 Nguyen et al.
2003/0121469 A1 7/2003 Lindfors et al.
2003/0121608 A1 7/2003 Chen et al.
2003/0140854 A1 7/2003 Kilpi
2003/0143328 A1 7/2003 Chen et al.
2003/0143747 A1 7/2003 Bondestam et al.
2003/0153177 A1 8/2003 Tepman et al.
2003/0172872 A1 9/2003 Thakur et al.
2003/0194493 A1 10/2003 Chang et al.
2003/0198740 A1 10/2003 Wendling
2003/0198754 A1 10/2003 Xi et al.
2003/0213560 A1 11/2003 Wang et al.
2003/0216981 A1 11/2003 Tillman
2003/0219942 A1 11/2003 Choi et al.
2003/0221780 A1 12/2003 Lei et al.
2003/0224107 A1 12/2003 Lindfors et al.
2003/0235961 A1 12/2003 Metzner et al.
2004/0005749 A1 1/2004 Choi et al.
2004/0011404 A1 1/2004 Ku et al.
2004/0011504 A1 1/2004 Ku et al.
2004/0013577 A1 1/2004 Ganguli et al.
2004/0014320 A1 1/2004 Chen et al.
2004/0015300 A1 1/2004 Ganguli et al.
2004/0016404 A1 1/2004 Gregg et al.
2004/0025370 A1 2/2004 Guenther
2004/0065255 A1 4/2004 Yang et al.
2004/0069227 A1 4/2004 Ku et al.
2004/0071897 A1 4/2004 Verplancken et al.
2004/0144308 A1 7/2004 Yudovsky
2004/0144311 A1 7/2004 Chen et al.
2004/0177813 A1 9/2004 Schieve et al.
2004/0203254 A1 10/2004 Conley, Jr. et al.
2004/0219784 A1 11/2004 Kang et al.
2004/0224506 A1 11/2004 Choi et al.
2004/0235285 A1 11/2004 Kang et al.
2004/0253375 A1 12/2004 Ivanov et al.
2005/0006799 A1 1/2005 Gregg et al.
2005/0059240 A1 3/2005 Choi et al.
2005/0064207 A1 3/2005 Senzaki et al.
2005/0070126 A1 3/2005 Senzaki
2005/0095859 A1 5/2005 Chen et al.
2005/0104142 A1 5/2005 Narayanan et al.
2005/0153571 A1 7/2005 Senzaki
2005/0233156 A1 10/2005 Senzaki et al.
2005/0255243 A1 11/2005 Senzaki

FOREIGN PATENT DOCUMENTS

EP 0 497 267 1/1992
EP 0 592 017 4/1994
EP 1 005 063 5/2000
EP 1 167 569 1/2002
EP 1 202 330 5/2002
EP 1202330 A2 5/2002
JP 58-098917 6/1983
JP 04-291916 9/1992
JP 05-206036 8/1993
JP 05-234899 9/1993
JP 05-270997 10/1993
JP 06-124520 5/1994
JP 06-224138 5/1994
JP 07-176472 7/1995
JP 05-047666 2/1996
JP 2000-319772 3/2000
JP 2001-020075 11/2000
JP 2000-212752 11/2002
WO WO 96/17107 6/1996
WO WO 99/01595 1/1999
WO WO 99/31299 6/1999
WO WO 99/65064 12/1999
WO WO 00/54320 9/2000
WO WO 00/79576 12/2000
WO WO 01/17692 3/2001
WO WO 01/36702 5/2001
WO WO 02/08488 1/2002
WO WO 02/45871 6/2002
WO WO 03/023835 3/2003
WO WO 2004/008491 1/2004

OTHER PUBLICATIONS

PCT Written Opinion dated Apr. 18, 2005 for PCT/ US04/007164.
PCT International Preliminary Report on Patentability dated Sep. 16, 2005 for PCT/US2004/007164.

SUBSTRATE SUPPORT LIFT MECHANISM

CROSS-REFERENCE TO RELATED APPLICATIONS

This application is a continuation of U.S. patent application Ser. No. 10/387,619, filed Mar. 12, 2003, now abandoned which is herein incorporated by reference.

BACKGROUND OF THE INVENTION

1. Field of the Invention

Embodiments of the present invention generally relate to a lift mechanism for controlling the position of a substrate support in a processing chamber.

2. Description of the Related Art

Many semiconductor processing operations, for example, chemical vapor deposition, physical vapor deposition and etch, among others, are performed in a vacuum environment. Typically, a substrate is positioned on a movable substrate support disposed within a processing chamber. The elevation of the substrate support is controlled by a lift mechanism so that the substrate may be disposed at a lower position within the processing chamber to facilitate substrate transfer and an elevated position that typically enhances substrate processing. As the spacing between the top of the processing chamber and the substrate seated on the substrate support may be 200 mils or closer when in the elevated position, the parallelism between the top of the processing chamber and the substrate support is a major attribute in maintaining process uniformity across the width of the substrate and ensuring process repeatability between substrates. For example, if one edge of the substrate is closer to the top of the processing chamber than another edge of the substrate, gases flowing between the substrates and the top of the processing chamber will be inclined to disadvantageously flow predominantly through the portion of the gap having the widest spacing, resulting in process non-uniformity across the width of the substrate. Additionally, variations in the distance between the substrate and the top of the processing chamber will typically result in process non-uniformity in plasma enhanced processes. As the intensity of the plasma formed between the substrate and the top of the processing chamber is dependent on the strength of the electrical field defined between the substrate support and the top of the processing chamber, which in turn is dependent on the distance between the substrate support and the top of the processing chamber. If this distance is not uniform, the plasma will not be uniform across the width of the substrate support and will contribute to process non-uniformity. Additionally, in the extreme cases, if the plane of the substrate support is not orientated perpendicular to the center line of the chamber, the plane of a wafer supported thereon may be skewed relative to the plane of operation of a transfer robot utilized to transfer the substrate to and from the processing chamber. In such instances, the end effector of the transfer robot may inadvertently collide with the substrate, causing particular generation and possibly knocking the substrate out of alignment. Moreover, if the lift pin mechanism is not parallel with the substrate support, the lift pins utilized to space the substrate from the substrate support may not extend uniformly through the substrate support, thereby causing the substrate to be supported in a skewed position that may lead to damage during transfer with the transfer robot as described above.

Typically, most substrate supports are coupled to their lift mechanisms by a mechanism in a manner that allows for the plane of the substrate support to be adjusted perpendicular to the center line of the processing chamber. However, many of the adjustment mechanisms utilized to level the substrate support are difficult to secure in a desired position. Furthermore, most adjustment mechanisms do not provide against drift during the securing procedures that is detrimental to systems requiring close parallelism tolerancing.

FIG. 8 depicts one embodiment of a conventional clamping arrangement 800 that is commonly utilized in a processing chamber 820 to couple a substrate support 810 to a lift mechanism 816. The clamping arrangement 800 typically has a clamp block 802 having a hole 804 disposed therethrough. The hole 804 accepts a shaft 806 extending from a lower portion of a stem 808 supporting the substrate support 810. Thus, as the orientation of the shaft 806 within the clamp block 806 is adjusted, the angle of the plane of the substrate support may be adjusted about the center line of the shaft 806.

A disadvantage of such a clamping arrangement 800 is that a clamp screw 812 utilized to clamp hole 804 around the shaft 806 imparts a tangential force upon the shaft 802, thus exerting a rotational moment upon the substrate support 810 as shown by arrow 814. Thus, as the substrate support 810 is being clamped into position, the clamping force, tangential to the shaft 806, causes the parallelism of the substrate support 810 to disadvantageously draft away from a predefined, desired position.

Therefore, there is a need for an apparatus for controlling the position of a substrate support.

SUMMARY OF THE INVENTION

An apparatus for positioning a substrate support within a processing chamber is provided. In one embodiment, an apparatus for positioning a substrate support includes a yoke comprising a curved surface with a first slot formed therethrough, a base comprising a first surface adapted to support the substrate support and a curved second surface, wherein the curved second surface mates with the curved surface of the yoke and a first slot is formed through the curved second surface of the base, and a first threaded member disposed through the first slot in the yoke and the first slot in the base.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Figure 1:
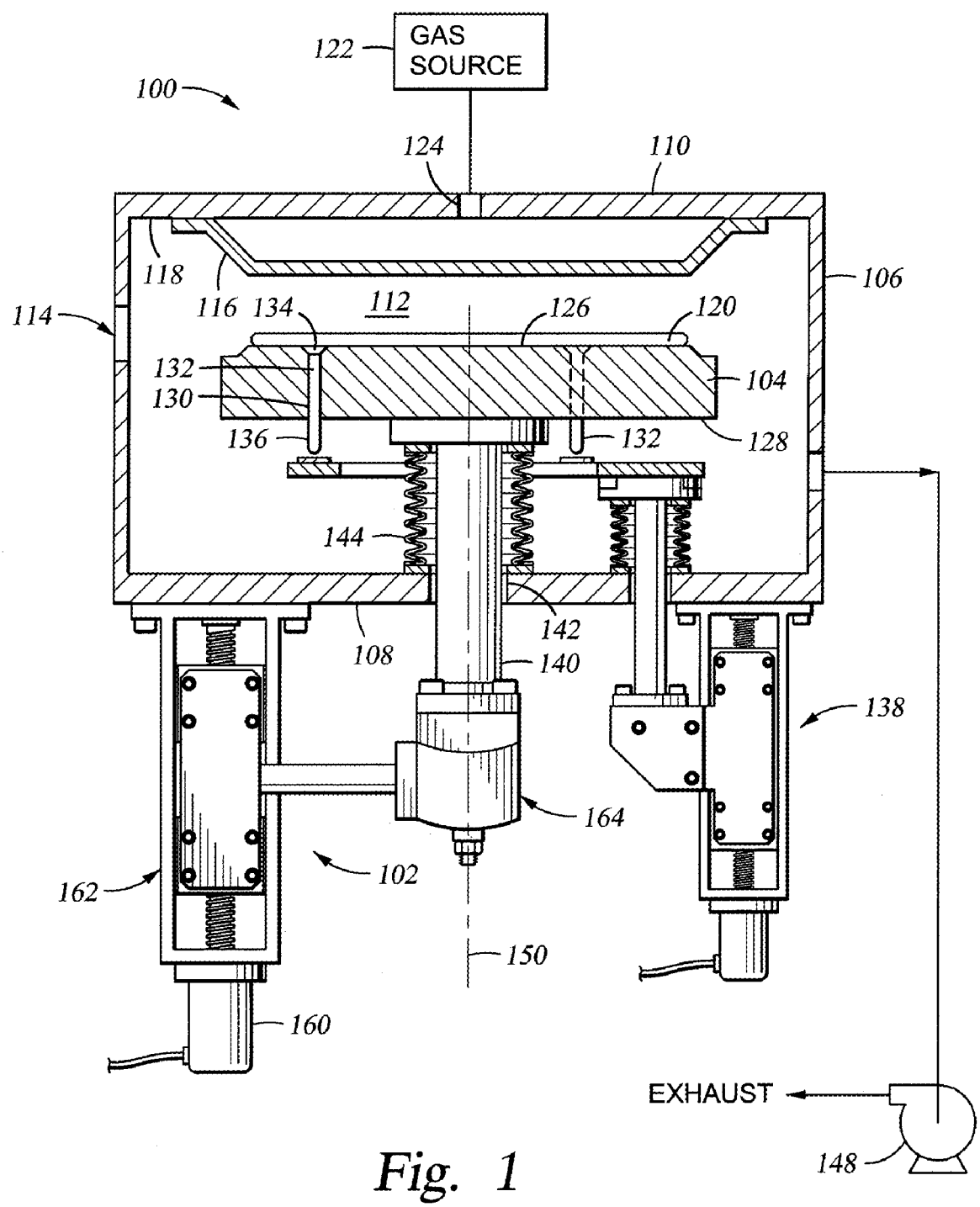
FIG. 1 is a simplified sectional view of a semiconductor processing chamber having a substrate support lift assembly of the present invention.

FIG. 1 is a simplified sectional view of a semiconductor processing chamber 100 having a substrate support lift assembly 102 for controlling the elevation of a substrate support 104 disposed within the processing chamber 100. Examples of processing chambers that may be adapted to benefit from the invention include WzX® and TxZ™ metal chemical vapor deposition chambers, both available from Applied Materials, Inc. located in Santa Clara, Calif. Although one embodiment of the substrate support lift assembly is illustrated coupled to a chemical vapor deposition chamber, the substrate support lift assembly may be utilized in other processing chambers such as physical vapor deposition chambers, etch chambers, ion implant chambers, rapid thermal anneal chambers, among other chambers wherein parallelism of the substrate support and a lid of the chamber is desirable.

The processing chamber 100 typically includes sidewalls 106 and a bottom 108 that support a lid 110 to define an interior volume 112 of the processing chamber. The processing chamber 100 is typically fabricated from a monolithic block of aluminum or welded from stainless steel plates. At least one wall 108 of the processing chamber 100 includes a substrate access port 114 to facilitate entry and egress of substrates from the processing chamber 100.

An exhaust port 146 is typically disposed in the sidewalls 106 or bottom 108 of the processing chamber 100 and is coupled to a pumping system 148. The pumping system 148 generally includes various pumping components such as throttle valves and turbomolecular pumps to evacuate and maintain the interior volume 112 of the processing chamber 100 at a predefined pressure during processing.

The lid 110 of the processing chamber 100 is typically removable to allow access to the interior volume 112 of the processing chamber 100. A showerhead 116 is coupled to an interior side 118 of the lid 110 to facilitate uniform distribution of process gases within the processing chamber 100 and across the surface of a substrate 120 positioned on the substrate support 104 during processing. One example of suitable showerhead is described in U.S. patent application Ser. No. 09/603,117, filed Jun. 22, 2000, which is hereby incorporated by reference in its entirety.

A gas source 122 is typically coupled to the processing chamber 100 to provide process and other gases to the interior volume 112. In one embodiment, the lid 110 includes an inlet 124 through which process and/or other gases are provided from the gas source 122 to a plenum defined between the showerhead 116 and the interior surface 112 of the lid 110. The plenum allows the process and other gases provided into the interior volume 112 of the processing chamber 100 to spread across the backside of the showerhead 116, thereby enhancing uniformity of gas distribution through the showerhead 116 and across the substrate 120.

The substrate support 104 is disposed in the interior volume 112 of the processing chamber 100 and may be controlled in elevation along a central axis 150 between a processing position approximate the showerhead 116 and a lower transfer position aligned with the access port 114. The substrate support 104 may be a susceptor, heater, vacuum chuck, an electrostatic chuck or other platform for supporting the substrate 120 during processing or transfer. The substrate support 104 may be fabricated from ceramic, aluminum, stainless steel or other materials compatible with processing temperatures and chemistries. Two examples of substrate supports which may be adapted to benefit from the invention are described in U.S. patent application Ser. No. 09/596,854, filed Jun. 19, 2000 and U.S. patent application Ser. No. 10/055,634, filed Jan. 22, 2002, both of which are hereby incorporated by reference in their entireties.

The substrate support 104 has an upper surface 126 that supports the substrate 120 and an opposing lower surface 128 facing the chamber bottom 108. A plurality of holes 130 (one is shown in FIG. 1) are formed through the substrate support 104 and are adapted to receive lift pins 132 utilized to space the substrate 120 from the upper surface 126 during substrate transfer. The lift pins 132 typically have a flared first end 134 that is flush with, or slightly recessed from, the upper surface 126 of the substrate support 104 and a second end 136 that extends beyond the lower surface 128 of the substrate support 104.

The second end 136 of the lift pins 132 may be selectively actuated by a lift pin actuation mechanism 138. The lift pin actuation mechanism 138 displaces the second end 136 of the lift pins 132 toward the lower surface 128 of the substrate support 104, thereby causing the flared first end 134 of the lift pins 132 to project above the upper surface 126 to space the substrate 120 from the substrate support 104. One lift pin mechanism that may be adapted to benefit from the invention is described in U.S. patent Ser. No. 09/698,814 filed Oct. 26, 2000, which is hereby incorporated by reference in its entirety.

A stem 140 is disposed through an aperture 142 formed in the bottom 108 of the processing chamber 100 and connects the substrate support 104 to the substrate support lift mechanism 102. The stem 140 is typically hollow and/or includes passages formed therethrough to facilitate coupling of power leads, sensors, control lines, fluid lines and other utilities (not shown) from the substrate support 104 to the exterior of the processing chamber 100. A bellows 144 is typically provided circumscribing the stem 140 to provide a flexible seal that facilitates elevation control of the substrate support 104 without vacuum leakage from the interior volume 112 of the processing chamber 100.

The substrate support lift mechanism 102 is configured to allow the substrate support 104 to be adjusted along five axes and typically includes an actuator 160, a bearing assembly 162 and a gimbal assembly 164. In one embodiment, the bearing assembly 162 is coupled to the exterior side of the chamber bottom 108. The gimbal assembly 164 is coupled between the stem 140 and the bearing assembly 162 and is driven by the actuator 160 to control the elevation of the substrate support 104.

Figure 2A:
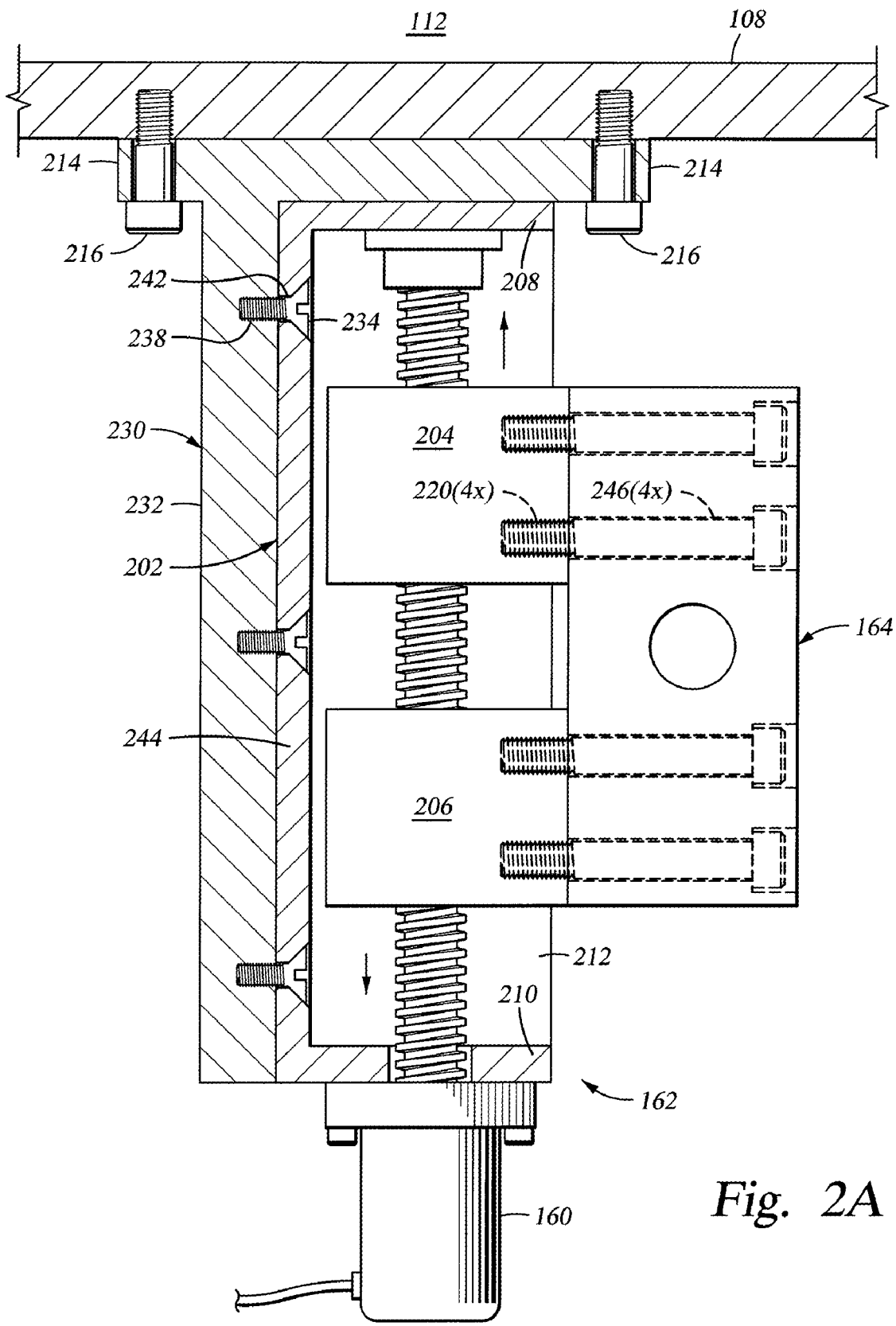
FIGS. 2A-B are sectional side and front views of one embodiment of a bearing assembly.
Figure 2B:
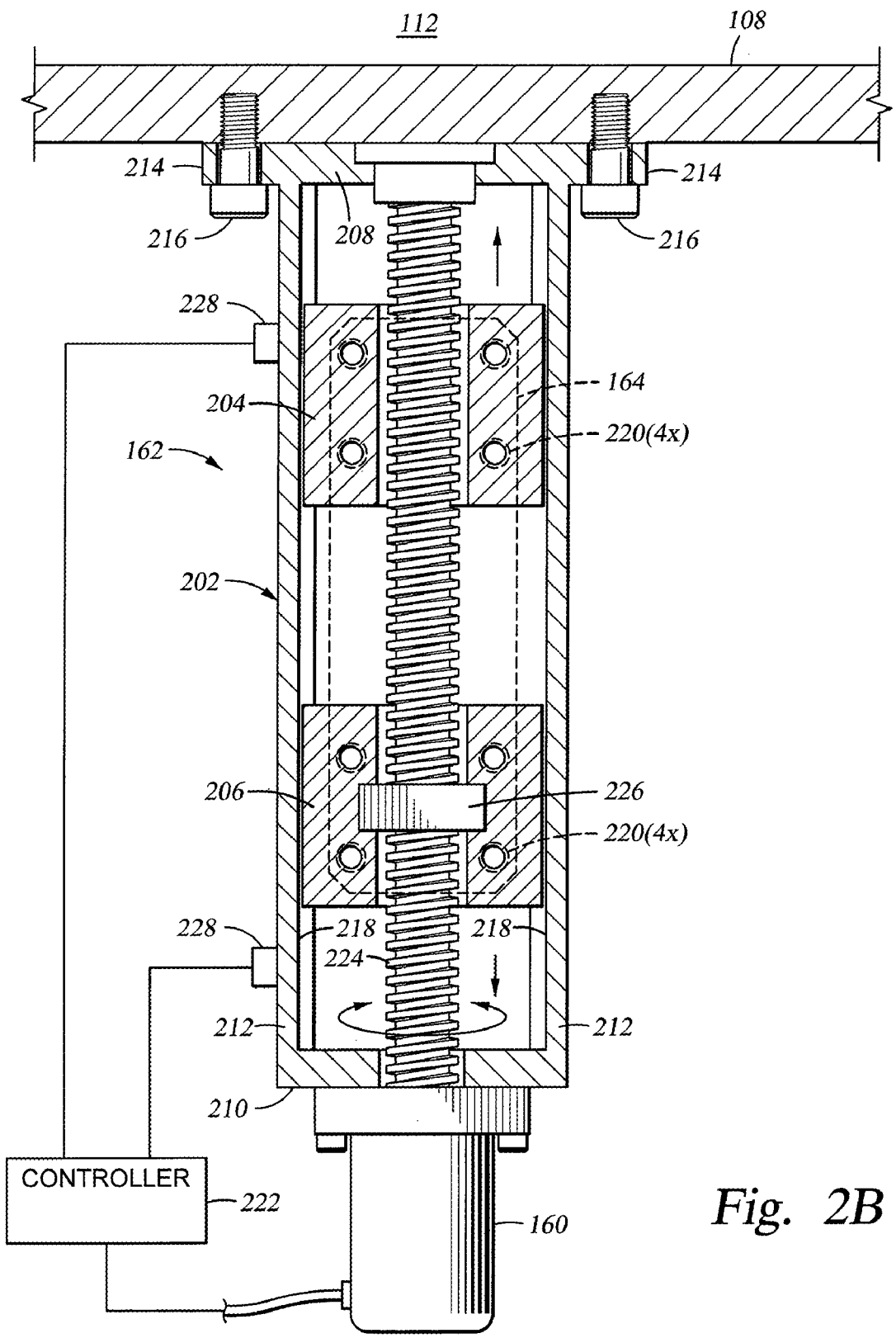

FIGS. 2A-B are sectional side and front views of one embodiment of the bearing assembly 162. The bearing assembly 162 is mounted to the chamber bottom 108 by a mounting bracket 230. The mounting bracket 230 includes a base 214 coupled to the chamber bottom 108 by a plurality of fasteners 216. A mounting flange 232 extends from the base 214 and is coupled to the bearing assembly 162 by a plurality of fasteners 234.

The bearing assembly 162 includes a rectangular frame 202 and at least two carriage blocks 204, 206. The rectangular frame 202 has a first end 208 adapted for coupling to the chamber bottom 108 separated from a second end 210 by two longitudinal members 212. A center member 244 is coupled between the two longitudinal members 212 to form a c-section. The center member 244 provides geometrical stability of the two longitudinal members 212. The center member 244 includes a plurality of mounting holes 242 through which the plurality of fasteners 234 pass through and thread into a threaded hole 238 formed in the mounting flange 232 of the mounting bracket 230.

The facing surfaces of the longitudinal members include bearing surfaces 218 between which the carriage blocks 204, 206 ride. The bearing surfaces 218 may be an integral part of the longitudinal members 212 or may alternatively be a separate outer race of a bearing that facilitates movement of the blocks 204, 206 along the frame 202.

The bearing surfaces 218 and the carriage blocks 204, 206 form the inner and outer race for a plurality of bearings (not shown) disposed between the carriage blocks 204, 206 and the frame 202. The bearings may be ball, pin or tapered and are typically captured to recirculate about each carriage block 204, 206. Each carriage block 204, 206 includes a plurality of mounting holes 220 to facilitate coupling the bearing assembly 162 to the gimbal assembly 164. In the embodiment depicted in FIGS. 2A-B, each carriage block 204, 206 includes four mounting holes 220 that are threaded to accept a fastener 246 (shown in phantom in FIG. 2A) utilized to secure the bearing assembly 162 and gimbal assembly 164.

The actuator 160 is typically mounted to the second end 210 of the frame 202 but may alternatively be mounted in other configurations that allow the actuator 160 to control the position of the carriage blocks 204, 206 relative to the frame 202. The actuator 160 may be an electric motor, air motor, pneumatic cylinder, hydraulic cylinder, solenoid, ball screw, lead screw or other motion device adapted to control the linear position of the carriage blocks 204, 206. The actuator 160 is coupled to a controller 222 that controls the actuator's motion. In the embodiment depicted in FIG. 2B, the actuator 160 is a stepper motor or server motor that drives a lead screw 224. The lead screw 224 passes through a thrust nut 226 disposed or otherwise coupled to the second carriage block 206. As the actuator 160 controllably rotates the lead screw 224, the lead screw 224 imparts a force on the nut 226 held stationary in the second carriage block 206 that causes the nut 226 and carriage block 206 to move along the frame 202.

One or more sensors 228 are typically coupled to the substrate support lift assembly 102 to provide positional feedback to the controller 222 indicative of the elevation of the substrate support 104 within the processing chamber 100. The sensors 228 may include LVDT sensors, proximity sensors, read switches, Halifax switches, proximity switches, limit switches, motor encoders and the like. In the embodiment depicted in FIG. 2B, the sensors 228 comprise a first proximity switch and a second proximity switch coupled to the frame 202 of the bearing assembly 162. As the carriage blocks 204, 206 move between first and second ends 208, 210 of the frame 202, the presence of at least one of the carriage blocks 204, 206 adjacent the proximity switch (e.g., sensor 228) changes the state or output of that switch, thereby indicating the arrival of the substrate support 104 to a predefined position. The position of the sensors 228 on the frame 202 is adjustable so that the stroke of the substrate support 104 may be set within a predefined range of motion and adjust to a predefined elevation within the processing chamber 100. By incorporating two carriage blocks 202, 206 within the frame 202, the vacuum forces that act upon the substrate support 104 within the internal volume 112 of the processing chamber 100 which result in high tortional loads on the lift assembly that are distributed over larger load bearing surface areas, dramatically minimizing overall mechanical deflection, and thereby advantageously maintaining the parallelism of the substrate support 104 and the showerhead 116. This dual carriage bearing assembly 162 provides about a four-fold improvement in lateral deflection over conventional single carriage bearing assemblies.

Figure 3:
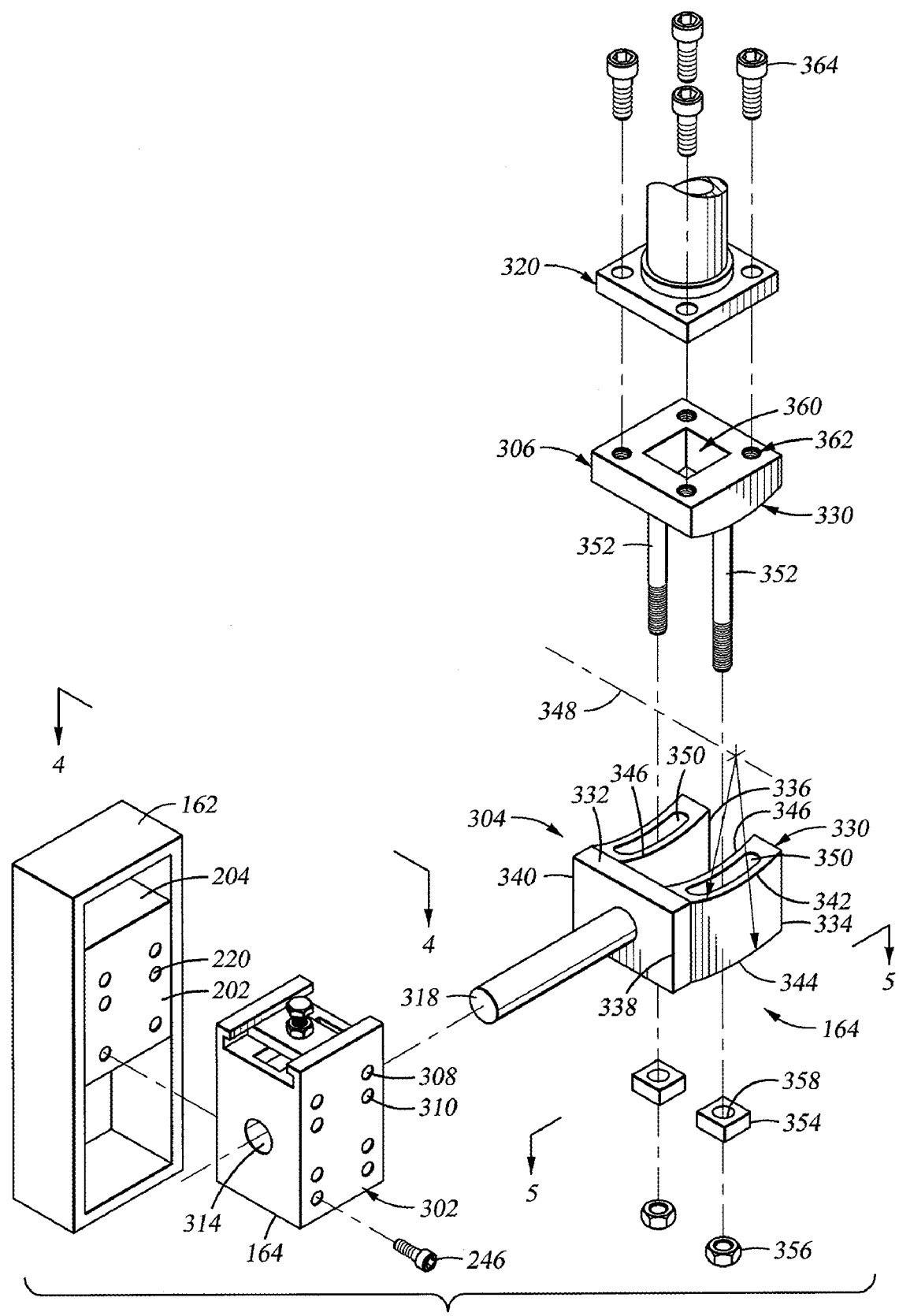
FIG. 3 is an exploded view of one embodiment of a gimbal assembly.

FIG. 3 depicts an exploded view of one embodiment of the gimbal assembly 164. The gimbal assembly 164 includes a clamp block 302, a yoke 304 and a gimbal base 306. The clamp block 302 is typically fabricated from aluminum or another suitable material and includes a plurality of mounting holes 308 utilized to couple the gimbal assembly 164 to the carriage blocks 204, 206. In the embodiment depicted in FIG. 3, each of the mounting holes 308 includes a counterbore 310 adapted to receive the head of each fastener 246 (one is shown in FIG. 3) which threads into a respective one of the mounting holes 220 formed in the carriage blocks 204, 206.

The clamp block 302 includes a clamping aperture 314 formed therein. The clamping aperture 314 is adapted to receive a post 318 extending from the yoke 304 to secure the orientation of the yoke 304 within the clamp block 302 while allowing axial and rotational adjustment of the post 318 relative to the clamping aperture 314.

Figure 4:
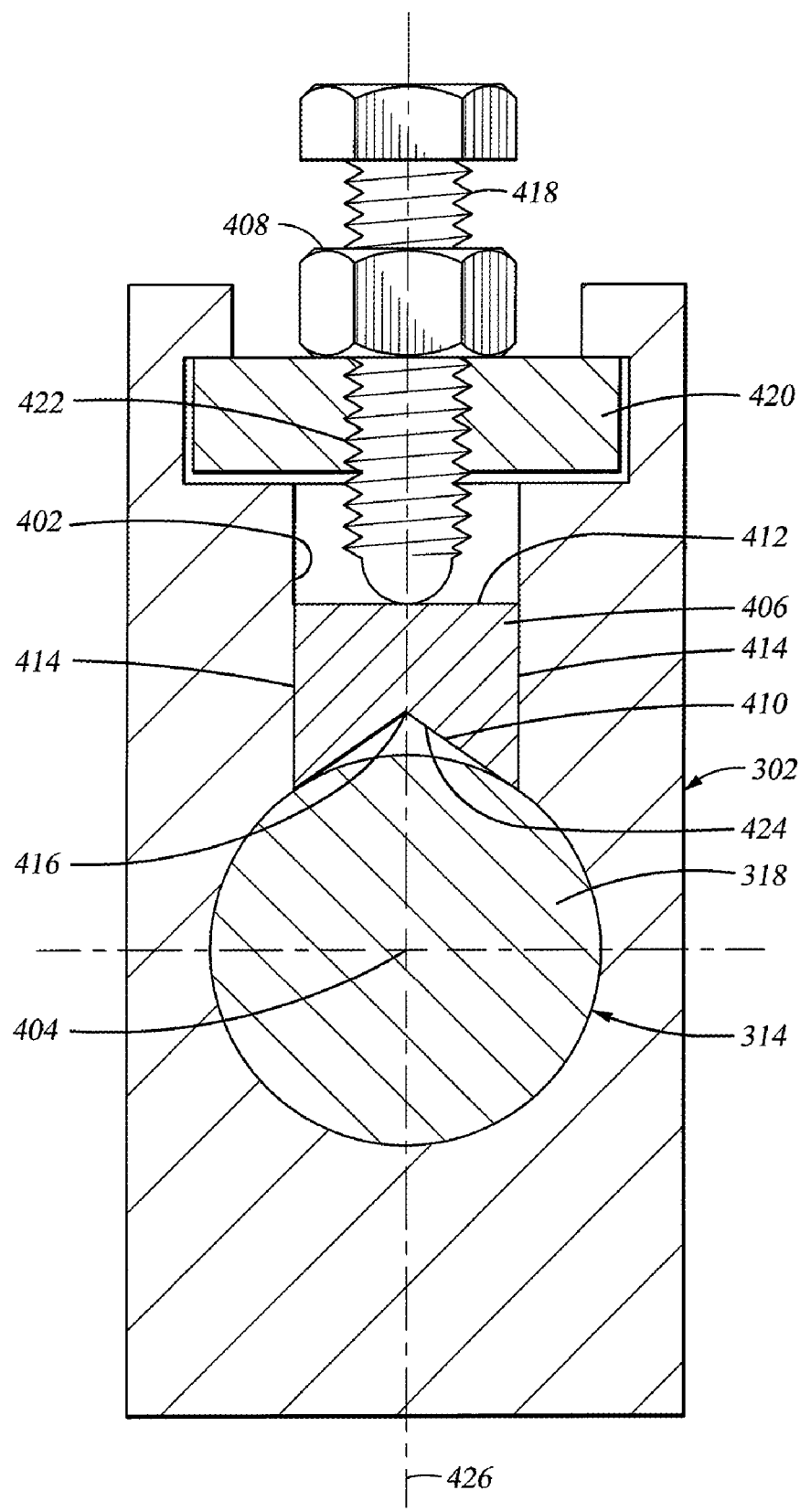
FIG. 4 is a sectional view of a gimbal assembly taken along section lines 4-4 of FIG. 3.

FIG. 4 is a sectional view of the clamp block 302 depicting one embodiment of the clamping aperture 314. The clamping aperture 314 is typically formed at least partially through the clamp block 302 in an orientation substantially perpendicular to the central axis 150 of the substrate support 104. A slot 402 is formed at least partially through the clamp block 302 in communication with the clamping aperture 314. The slot 402 is typically radially aligned with a center 404 of the clamping aperture 314. The slot 402 is adapted to receive a plunger 406 that may be urged through the slot 406 against the post 318 of the yoke 304, thereby fixing the position and rotational orientation of the yoke 304 relative to the clamp block 302. The plunger 406 may be urged against the post 318 and yoke 304 through any suitable means, including screws, motors, solenoids, over center clamps, clamps, electrostatic force, and the like.

In the embodiment depicted in FIG. 4, the clamp block 302 includes a first surface 410 disposed opposite a second surface 412 and separated by lateral surfaces 414. The lateral surfaces 414 are typically configured to guide the plunger 406 within the slot 402 so that a center 416 of the first surface 410 is urged into radial engagement with the post 318. A fastener 418 is disposed through a threaded hole 422 formed in a web 420 that bounds the end of the slot 402 opposite the clamping aperture 314. As the fastener 418 is threaded through the web 420, an end of the fastener 418 in contact with the post 318 urges the plunger 406 against the post 318 of the yoke 304, thereby securely clamping the post 318 in the aperture 314 of the clamp block 302. A jam nut or equivalent fixing method may be utilized to prevent the fastener 418 from backing out of the web 420 and allowing the post 318 to move. As the plunger 406 remains radially aligned with the aperture 314 and post 318 of the yoke 304 along an imaginary line 426 defined by the center of the aperture 314 and passing through the center of the slot 402, the clamping force is radially aligned and prevents the generation torque during clamping, advantageously preventing the yoke 304 from rotating relative to the clamp block 302 during clamping. Additionally, the angular orientation of the yoke 302 is advantageously maintained during clamping which preserves the parallelism of the substrate support 104 to the showerhead 116 within the processing chamber 100 during clamping.

To further prevent torque generation during clamping that could cause the yoke 304 to rotate relative to the clamp block 302, a clamping surface 424 of the plunger 406 may be configured to contact the post 318 at two locations. For example, the clamping surface 424 of the plunger 406 may include a "V" configuration, a step, depression, a radius or a curved surface configured to mate with the post 318 at least two locations equidistance from the center.

Returning to FIG. 3, the yoke 304 is typically fabricated from aluminum or other suitable rigid material and includes a bifurcated end 330 extending from the post 318. The bifurcated end 330 includes a cross member 332 centered on the post 318 and arranged in a substantially perpendicular orientation relative to the center axis of the post 318. A first mounting flange 334 is formed on a first end 338 of the cross member 332. A second mounting flange 336 is formed on a second end 340 of the cross member 332 and is typically oriented parallel with the central axis of the post 318.

Each mounting flange 334, 336 includes an upper side 342 and a lower side 344 separated by facing inner lateral sides 346. The lateral sides 346 of the adjacent mounting flanges 334, 336 define a space between the mounting flanges 334, 336 configured to allow routing of the various conduits and wires routed out of the stem 140.

In one embodiment, the upper side 342 of each flange 334, 336 is curved to facilitate adjusting the orientation of the gimbal base 306 seated on the mounting flange 334, 336. In the embodiment depicted in FIG. 3, the curvature of the upper side 342 typically has a radius of about 305 to about 304 mm relative to an axis 348 oriented substantially perpendicular to an offset from the central axis of the post 318. The lower side 334 of each mounting flange 334, 336 is typically convex and configured to have a radius defined from the axis 348.

Each mounting flange 334, 336 includes a slot 350 formed therethrough between the upper and lower sides 342, 344. The slot 350 is configured to accept a fastener or stud 352 extending from the gimbal base 306. A clamping block 354 is typically disposed on the portion of the stud 352 extending through the lower side 344 of the mounting flanges 334, 336. A nut 356 is threaded onto each of the studs 352 and may be tightened to urge a bottom surface 370 of the gimbal base 306 against the upper side 342 of the mounting flanges 334, 336. A contact surface 358 of the clamping block 354 typically is configured with the same radius as the lower side 344 of the mounting flanges 334, 336 to maintain axial tension on the studs 352 that substantially eliminates lateral drift of the studs 352 along the lower side 344 of the mounting flanges 334, 336 as the nuts 356 are tightened. Advantageously, this arrangement for coupling the gimbal base 306 to the yoke 304 allows the support surface of the substrate support 104 to be adjusted about an axis 348 perpendicular to the central axis of the yoke 304 and secured in that position without inducing any lateral forces on the stud that could compromise the parallelism of the substrate support 104 and the showerhead 116.

Figure 5:
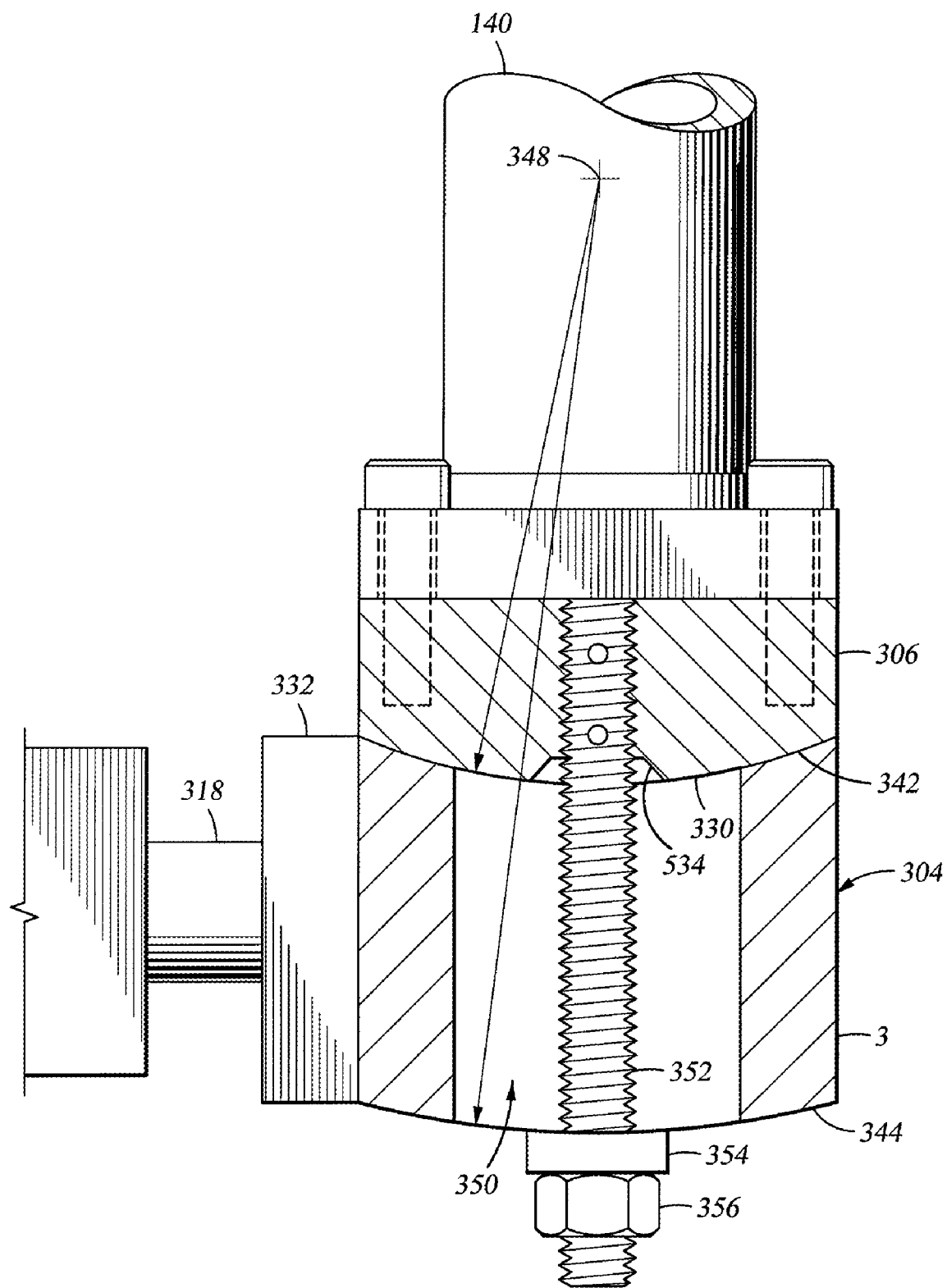
FIG. 5 is a sectional view of a gimbal assembly taken along section line 5-5 of FIG. 3.

FIG. 5 is a sectional view of the yoke 304 and gimbal base 306. To further enhance the precision of the alignment between the gimbal base 306 and the yoke 304, the bottom surface 370 of the gimbal base 306 that engages the upper side 342 of each mounting flange 334, 336 is configured to contact the upper side 342 of the mounting flanges 334, 336 in two places. For example, in the embodiment depicted in FIG. 5, a stepped depression 534 is formed in the bottom surface 370 around each stud 352. The stepped depressions 534 provide dual contact points that are symmetrical about the studs 352, thus preventing the gimbal base 306 from rocking on the yoke 304 as the nuts 356 are tightened and thereby maintaining the desired planar orientation of the substrate support 104 during clamping.

Referring additionally to FIG. 3, the gimbal base 306 is typically configured with a slot or central aperture 360 to facilitate routing of the various conduits and wires exiting the stem 140. The gimbal base 306 also includes a plurality of mounting holes 362 formed therein that respectively accept a plurality of fasteners 364 (one of which are shown in FIG. 3) that thread into a threaded hole 534 formed in a base plate 320 of the stem 140 thereby coupling the gimbal base 306 to the stem 140. The mounting holes 362 include a counter bore 530 having that allows the fasteners 364 to seat below the bottom surface 370 of the gimbal base 306. Holes 532 formed in the yoke 304 substantially align with the counter bores 530 and are of sufficient diameter that allows passage of the fasteners 364 through the yoke 304 and into the gimbal base 306 through a range of angular orientation between the yoke 304 and into the gimbal base 306, thereby allowing the substrate support 104 to be removed after angular alignment of the substrate support 104. The holes 532 may optionally be part of the slot 350. As the gimbal assembly 164 is not susceptible to drift due to the axial and radial loading of the clamping mechanisms, the base plate 320 of the stem 140 may be unfastened from the gimbal base 306 to facilitate removal, surface and/or replacement of the substrate support 104 without having to realign the substrate support 104 relative to the plane of the lid 110 and showerhead 116 upon re-installation of the substrate support 104.

Figure 6:
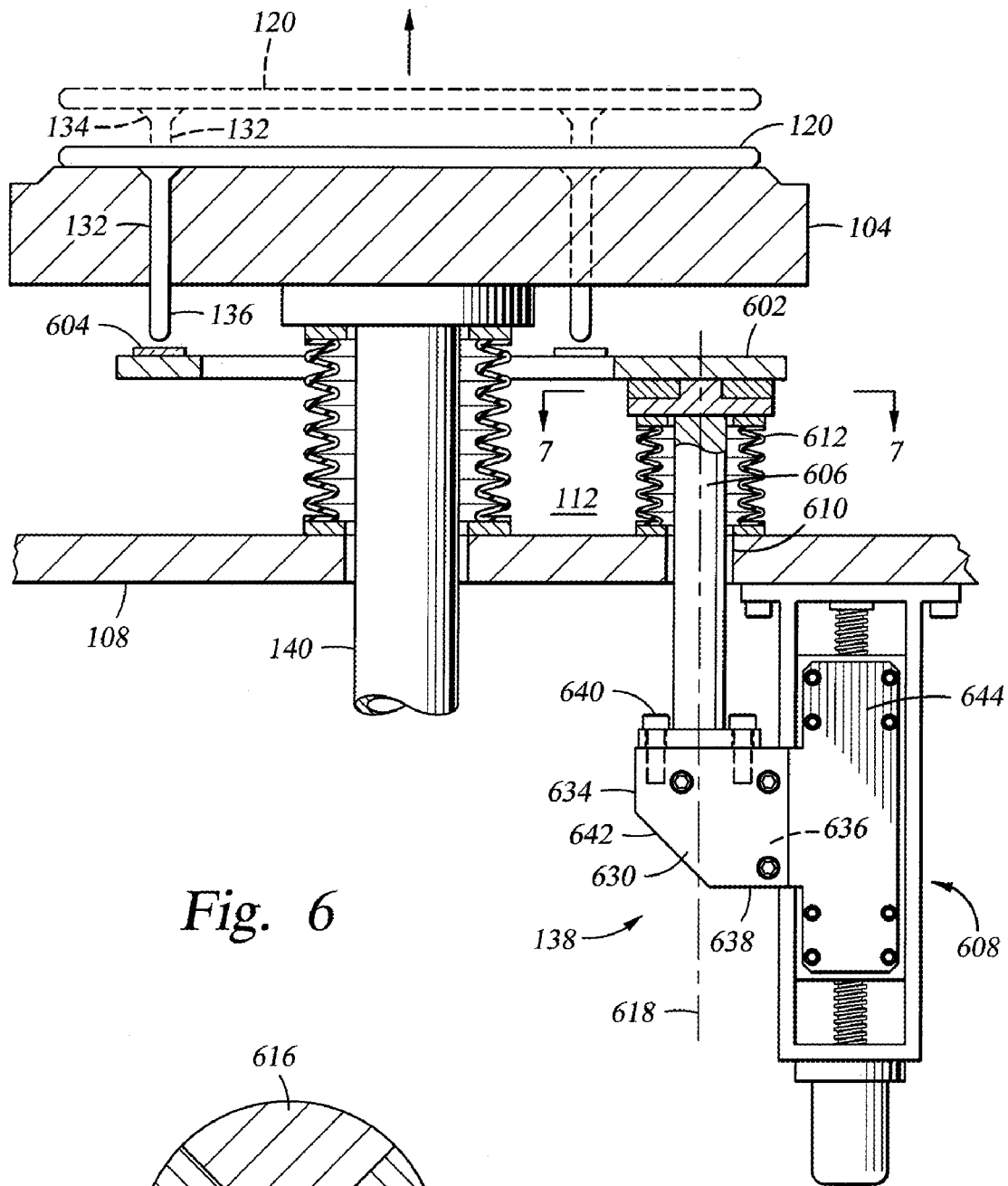
FIG. 6 is a sectional view of one embodiment of a lift pin actuation mechanism.

FIG. 6 depicts one embodiment of the lift pin actuation mechanism 138. The lift pin actuation mechanism 138 typically includes an annular lift plate 602 that is disposed below the second end 136 of the lift pins 132 and circumscribes the stem 140. The lift plate 602 is typically fabricated from aluminum and may include a plurality of ceramic contact pads 604 adapted to contact the lift pins 134 as the lift plate 602 is actuated toward the substrate support 104.

Figure 7:
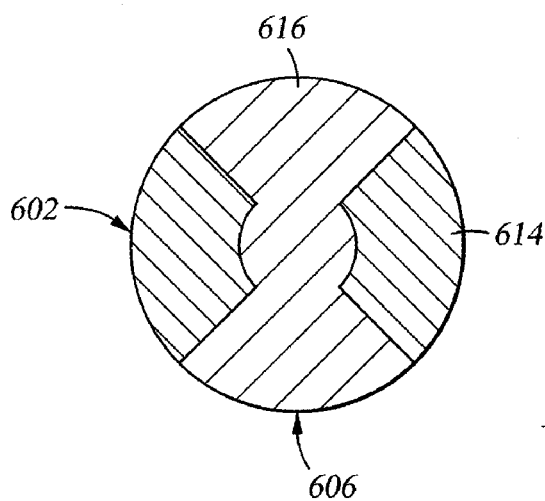
FIG. 7 is a sectional view of the lift pin actuation mechanism taken along section line 7-7 of FIG. 6.
Figure 8:
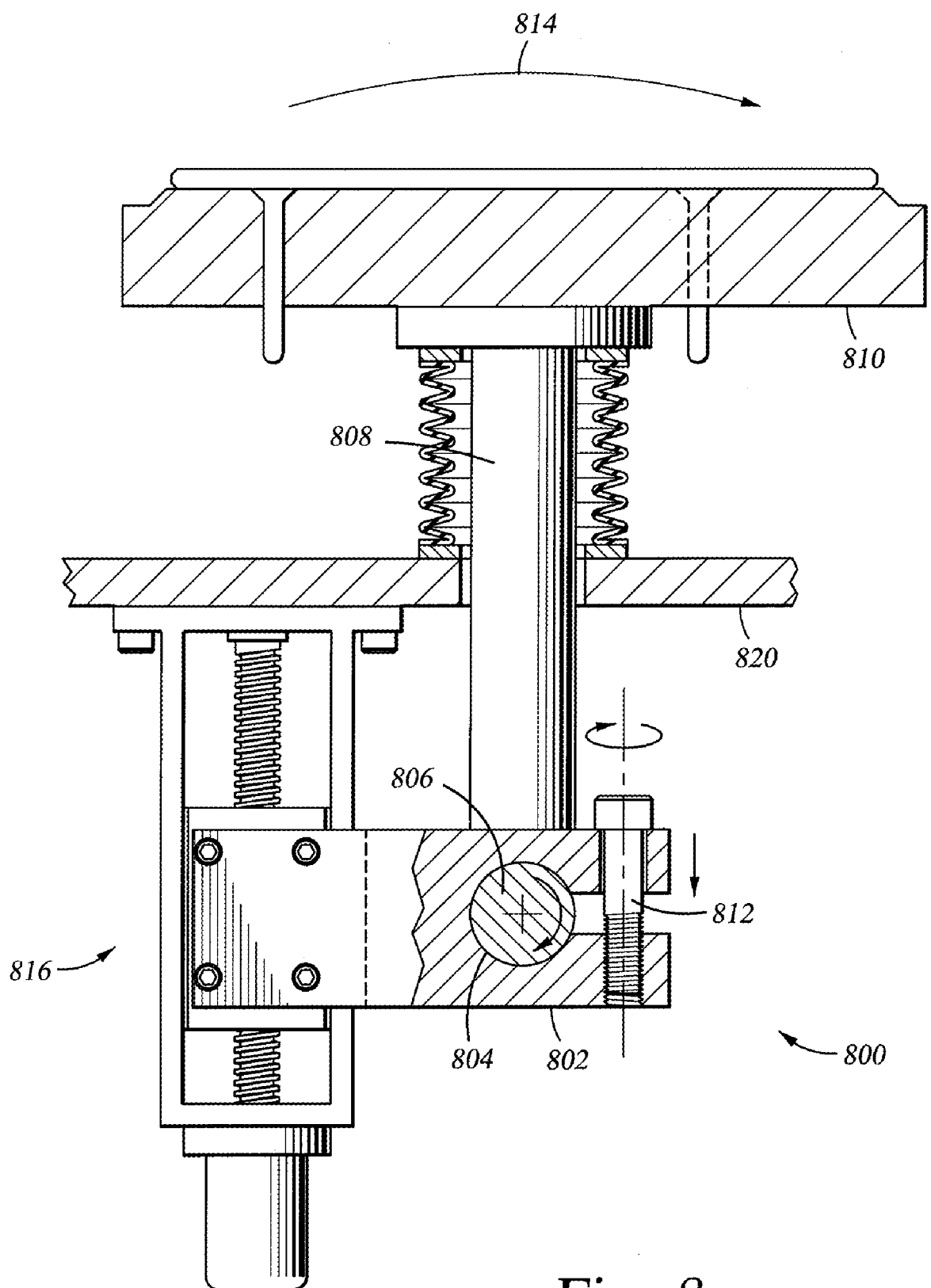
FIG. 8 is a sectional view of a conventional clamping arrangement utilized to couple a substrate support to a lift mechanism.

In one embodiment, the lift pin actuation mechanism 138 includes a lift plate 602 coupled by an actuation rod 606 to an actuator assembly 608. In order to minimize deflection between the lift plate 602 and rod 606, the mating surfaces of the lift plate 602 and rod 606 include a plurality of mating wedge-shaped keys 614, 616 (seen in FIG. 7). The keys 614, 616 are typically configured to expand and create an interference fit at processing temperatures, thus eliminating movement between the lift plate 602 and rod 606 associated with part tolerancing. One example of a lift plate and rod coupled in a similar arrangement is described in U.S. patent application Ser. No. 09/652,727, filed Oct. 31, 2000, which is hereby incorporated by reference in its entirety.

The rod 606 extends through an aperture 610 formed in the bottom 108 of the process chamber 100 and is coupled to the actuator assembly 608. A bellows 612 is typically disposed around the rod 606 to provide a flexible seal between the processing chamber 100 and the pin lift actuation mechanism 138 to prevent leakage into the chamber while facilitating actuation of the lift pins 132.

The actuator assembly 608 is typically coupled between the rod 606 and the chamber bottom 108 to control the elevation of the lift plate 602 and lift pins 132. The actuator assembly 608 may include solenoids, gear motors or other actuator suitable for controllably actuating the shaft in an axial direction. In one embodiment, the actuation assembly 608 is similar to the bearing assembly and actuator described above.

A spar 630 is utilized to couple the rod 606 to the actuator assembly 608. The spar is typically fabricated from aluminum or other suitably rigid material. The spar 630 includes a mounting side 632 and an opposing lower side 638 separated by first and second lateral sides 634, 636. The mounting side 632 of the spar 630 is coupled to the rod 606 by a plurality of fasteners 640. The second lateral side 636 is typically coupled to a bearing assembly 644 of the actuator assembly 608. The lower side 638 may include a chamfer 642 at the junction of the first lateral side 634 and the lower side 638.

The lateral sides 634, 636 are typically longer than the mounting side 632 to minimize deflection of the actuation mechanism 138 due to vacuum forces acting upon the annular plate 602 disposed within the chamber 100. To further stiffen the spar 630, the lower side 638 typically extends from the second lateral side 636 beyond a center line 618 of the rod 606 before the chamfer 642. As the rigidity of the spar 630 is superior to conventional L-shaped brackets commonly used in conventional designs, the reduced deflection of the lift pin actuation mechanism 138 enhances the planarity between the plate 602 and the substrate support 104, thereby allowing the substrate 102 to retain its parallelism to the substrate support 104 when spaced therefrom by the lift pins 132 displaced by the plate 602.

As discussed above, maintaining the parallelism between the lid 110 and the upper support surface 126 of the substrate support 104 is important for maintaining process uniformity and repeatability. The invention also improves the parallelism of the substrate 120 when spaced from the substrate support 104 that minimizes particular generation or wafer damage during robotic wafer exchange. In one aspect of the invention, the substrate support lift assembly 102 experiences reduced tortional deflection when the substrate support 104 is exposed to a vacuum within the processing chamber 100. In another aspect of the invention, the spaced bearing surfaces of the carriage blocks 204, 206 maintains parallelism of the substrate support 104 to the lid 110 as the substrate support 104 is moved between the elevated and lowered position. Additionally, the dual carriage blocks 204, 206 minimize deflection of the lift 102 thereby maintaining the desired planar orientation of the substrate support 104 when the substrate support 104 is subjected to vacuum forces. In another aspect of the invention, the lift pin actuation mechanism 138 is configured to minimize deflection under vacuum loading of the lift mechanism 138 to enable simultaneous contact and substantially equal displacement of the lift pins, resulting in enhanced parallelism of the substrate and substrate support when spaced apart to facilitate wafer exchange with a robotic mechanism while minimizing the probability of inadvertent wafer to robot contact due to misalignment and/or deflection issues.

While the foregoing is directed to the preferred embodiment of the present invention, other and further embodiments of the invention may be devised without departing from the basic scope thereof, and the scope thereof is determined by the claims that follow.

The invention claimed is:

1. An apparatus for processing a substrate, comprising:
   a processing chamber;
   a substrate support for supporting a substrate within the processing chamber; and
   an assembly for positioning the substrate support, comprising:
      a clamp block;
      a yoke comprising at least one flange with a curved surface, the flange having a slot formed therethrough, wherein the yoke is coupled with the clamp block, the yoke positional along and rotational about a first axis relative to the clamp block;
      a base comprising a first surface adapted to support the substrate support and a curved second surface mating with the curved surface of the flange, wherein a first slot is formed through the curved second surface of the base, the base movable about a second axis orthogonal to the first axis;
      a first threaded member disposed through the slot in the flange and urging the yoke and base against each other along the axis of the first threaded member;
      a bearing assembly having a first carriage block and a second carriage block, the bearing assembly coupled with the clamp block; and
      an actuator coupled with at least one of the carriage blocks and adapted to control the linear position of the carriage blocks along the bearing assembly.

2. The apparatus of claim 1, wherein the clamp block has a clamping aperture formed therein for receiving a post extending from the yoke.

3. The apparatus of claim 2, wherein the clamp block has a slot formed at least partially through the clamp block and communicating with the clamping aperture, and the clamp block further comprises a plunger disposed in the slot and movable in a direction radially aligned with a center of the clamping aperture.

4. The apparatus of claim 3, wherein the plunger includes a contact surface that, when urged against the post, does not exert a rotational moment force upon the post.

5. The apparatus of claim 4, wherein the clamp block further comprises: a web disposed over the slot opposite the clamping aperture; and
   a member disposed through the web and radially aligned with the center of the clamping aperture, the member adapted to urge the plunger against the post.

6. The apparatus of claim 1, wherein the first threaded member is radially aligned relative to the curved surface of the flange.

* * * * *